(12) United States Patent
Feng et al.

(10) Patent No.: US 8,361,903 B2
(45) Date of Patent: Jan. 29, 2013

(54) METHOD AND APPARATUS FOR ULTRA THIN WAFER BACKSIDE PROCESSING

(75) Inventors: Tao Feng, Santa Clara, CA (US); Ming Sun, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 218 days.

(21) Appl. No.: 12/753,426

(22) Filed: Apr. 2, 2010

(65) Prior Publication Data

US 2010/0221431 A1 Sep. 2, 2010

Related U.S. Application Data

(62) Division of application No. 11/712,846, filed on Feb. 28, 2007, now Pat. No. 7,776,746.

(51) Int. Cl.
*H01L 21/302* (2006.01)

(52) U.S. Cl. ........ 438/690; 438/460; 438/691; 438/694; 216/88

(58) Field of Classification Search .................. 438/460, 438/462, 464, 690, 691, 692, 694, 697, 695, 438/719; 451/261, 262; 216/88, 90, 99
See application file for complete search history.

(56) References Cited

U.S. PATENT DOCUMENTS

| | | | | |
|---|---|---|---|---|
| 6,337,258 | B1* | 1/2002 | Nakayoshi et al. | 438/464 |
| 7,776,746 | B2* | 8/2010 | Feng et al. | 438/690 |
| 2001/0023995 | A1* | 9/2001 | Nguyen et al. | 257/787 |
| 2007/0004180 | A1* | 1/2007 | Abe | 438/460 |

\* cited by examiner

*Primary Examiner* — Lan Vinh
(74) *Attorney, Agent, or Firm* — James Cai; Schein & Cai LLP

(57) ABSTRACT

A method and apparatus for ultra thin wafer backside processing are disclosed. The apparatus includes an outer ring holding a high temperature grinding and/or dicing tape to form a support structure. An ultra thin wafer or diced wafer is adhered to the tape within the ring for wafer backside processing. The wafer backside processing includes ion implantation, annealing, etching, sputtering and evaporation while the wafer is in the support structure. Alternative uses of the support structure are also disclosed including the fabrication of dies having metalized side walls.

25 Claims, 9 Drawing Sheets

METHOD AND APPARATUS FOR ULTRA THIN WAFER BACKSIDE PROCESSING

CROSS REFERENCE TO RELATED PATENT APPLICATIONS

The instant patent application is a divisional patent application of and claims priority to U.S. patent application Ser. No. 11/712,846 filed on Feb. 28, 2007 now U.S. Pat. No. 7,776,746 which is herein incorporated by reference in its entirety.

BACKGROUND OF THE INVENTION

1. Field of the Invention

The present invention relates to wafer processing and more particularly to a method and apparatus for ultra thin wafer backside processing.

2. Description of Related Art

Several factors are driving the trend toward thinner chips having dimensions of less than 4 mils. Such ultra thin chips generally result in lower substrate resistance, allow for the stacking of chips to meet package thickness requirements, and avoid costly thick epitaxial layers in high voltage applications.

Conventionally, a temporary support substrate or carrier can be adhered, usually through an adhesive layer, to the front side of a device wafer to facilitate wafer back grinding and a subsequent thin wafer handling and back side processing. The carrier can be dummy silicon wafer, glass wafer, polymer or polymer based composite substrate, or thick tape. A rigid carrier helps to reduce wafer warping and prevents wafer breakage during handling and processing. However, removal of the carrier usually involves complex operations and thus leads to low throughput as well as the risk of wafer breakage.

In another approach, a rigid edge ring can be formed on the periphery of a thin wafer to facilitate thin wafer handling and processing. The ring can be obtained by etching or mechanically back grinding a wafer while leaving an edge on the wafer periphery intact, or by adhering an extra ring on the periphery of a thin wafer. However, this approach suffers the disadvantage of having a low throughput during wafer thinning and/or edge ring removal, as well as having a reduced active area (due to the wafer area devoted to the circumference).

There is therefore a need in the art for a method and apparatus for ultra thin wafer backside processing that overcomes the disadvantages of the prior art. The method and apparatus preferably provide for improved throughput with low risk of wafer breakage. The method and apparatus also preferably provide for wafers of 4 to 2 mils thickness and less at a low cost. The method and apparatus further preferably provide for a high wafer area usage.

SUMMARY OF THE INVENTION

In accordance with one aspect of the invention, a method for ultra thin wafer backside processing includes the steps of mounting a ring and a wafer to a high temperature grinding and dicing tape with a wafer front side adhered to the tape, grinding a wafer back side, wafer back side processing such as ion implantation, annealing, etching and metallization, followed by wafer dicing.

In accordance with another aspect of the invention, a support structure for wafer backside processing includes a ring and a tape held by the ring, and a wafer adhere able to the tape within the ring.

In accordance with yet another aspect of the invention, a method for ultra thin wafer backside processing includes the steps of half dicing a wafer, transferring the half diced wafer to a tape supported by a ring, backside grinding the wafer to separate dies, followed by back side processing such as ion implantation, annealing, etching and metallization.

In accordance with another aspect of the invention, a method of depositing metal on side walls of a die includes the steps of forming or mounting a plurality of dies to a tape supported by a ring, and depositing metal onto a back side and side walls of the plurality of die.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of functional components and to the arrangements of these components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF PREFERRED EMBODIMENTS OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Figure 1:
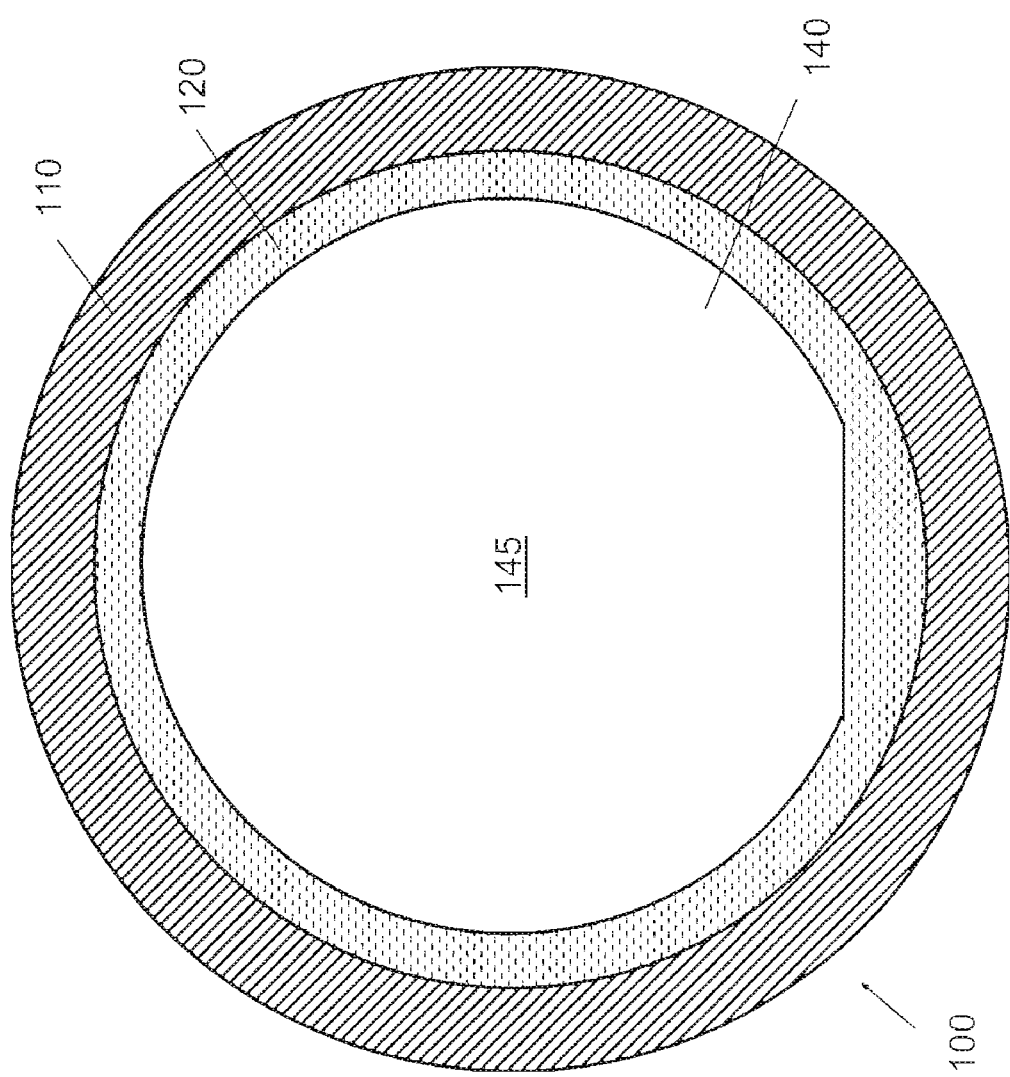
FIG. 1 is a top plan view of an apparatus for ultra thin wafer backside processing in accordance with the invention.
Figure 2:
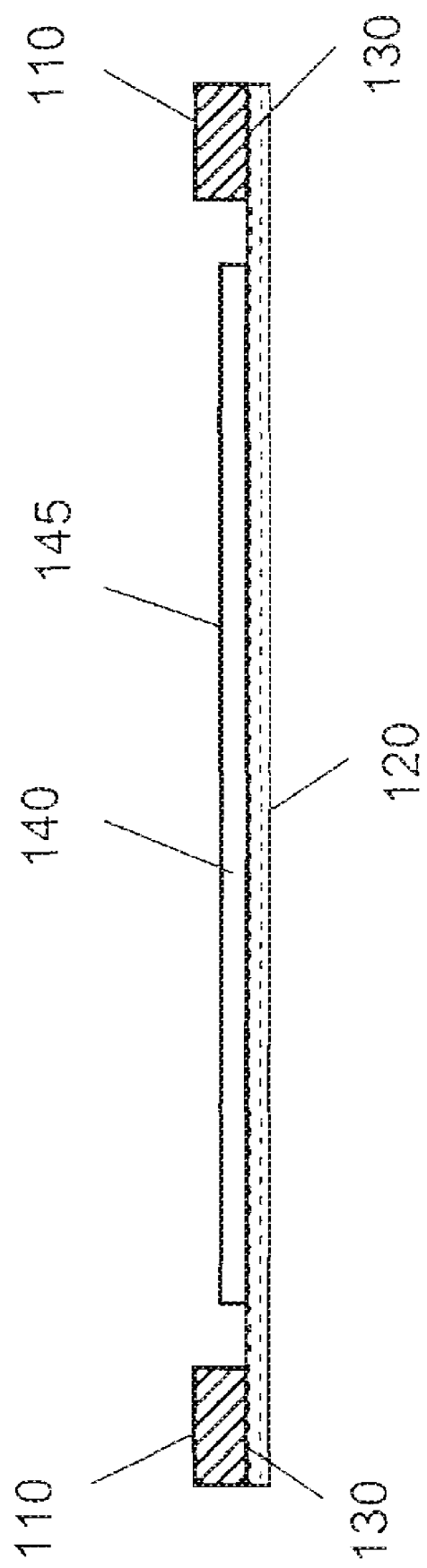
FIG. 2 is a side elevation view of the apparatus of FIG. 1.

An apparatus for ultra thin wafer backside processing generally designated 100 is shown in FIG. 1 and FIG. 2. The apparatus 100 comprises an outer ring 110 of generally toroidal configuration that is formed of any rigid material such as metal or a semiconductor. Outer ring 110 may have any configuration and preferably has a rectangular cross section for facilitating the use of the apparatus with a clamp. The outer ring 110 may be sized to accommodate therewithin a wafer 140. In an exemplary embodiment, the outer ring 110 may have an outer diameter of 8 inches to accommodate therewithin a 6-inch wafer.

The apparatus for ultra thin wafer backside processing 100 further comprises a high temperature grinding and/or dicing tape 120 affixed or otherwise adhered about the outer ring 110 on a bottom surface 130 thereof. The outer ring 110 is operable to provide a holding mechanism for, and rigid support to, the high temperature tape 120. For this purpose, the outer ring 110 may also be formed in, and integrated with, other structures. Tape 120 may include a back grinding and/or dicing tape that can resist the temperatures associated with wafer backside processing such as metallization. In combination, the apparatus 100 comprising the outer ring 110 and the tape 120 provide a novel support structure for wafer backside processing.

Figure 3:
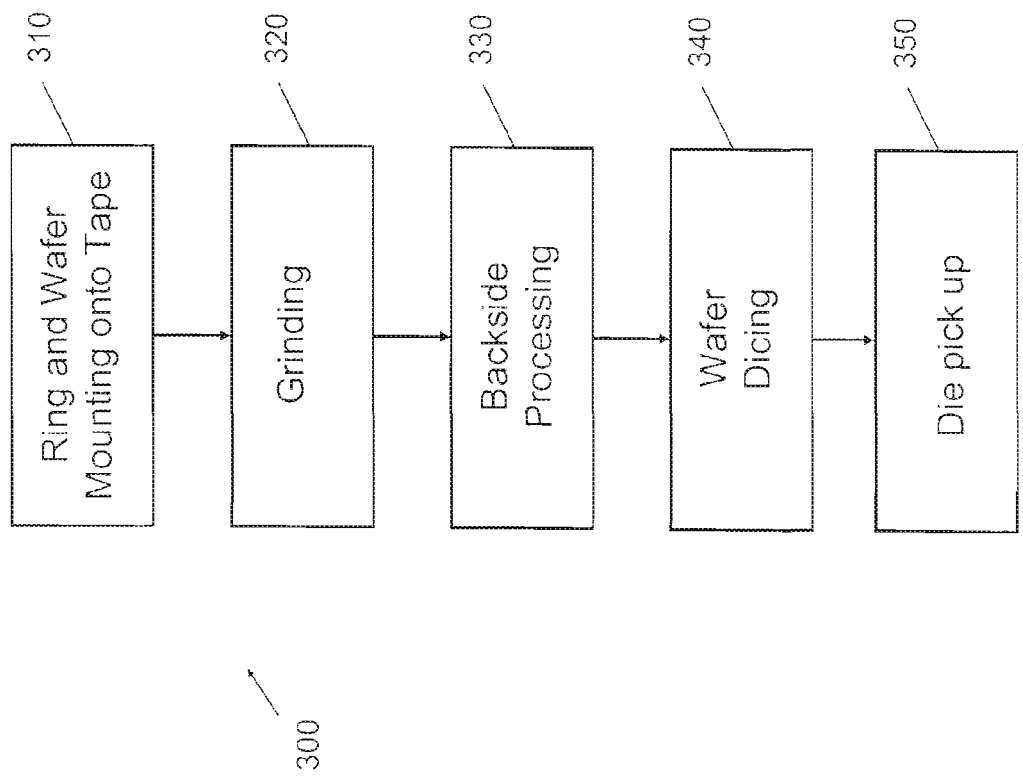
FIG. 3 is a flow chart of a method for ultra thin wafer backside processing in accordance with the invention.

The apparatus 100 may be constructed in a step 310 of a method 300 in accordance with a preferred embodiment of the invention (FIG. 3). The outer ring 100 and the wafer 140 are mounted to the tape 120 in this step. In a step 320 a backside 145 of the wafer 140 is ground and optionally polished to a desired thickness. Wafers having a thickness on the order of less than 4 mils are achieved by the method 300.

With the ground wafer supported by the apparatus 100, wafer backside processes such as ion implantation, etching, sputtering, and evaporation are next performed in a step 330. The tape 120 may optionally be annealed to minimize the chance of out-gassing from the tape 120 and it's adhesive. The annealing may be performed in a vacuum furnace.

In a step 340, the wafer 140 is diced from the backside 145 to yield a plurality of die that are then picked in a die pick-up process in a step 350. Since direct handling of the ultra thin wafer is reduced to a minimum, a high throughput with low wafer breakage rate is achieved in accordance with the method of the invention.

In another preferred embodiment of the invention, the wafer 140 may be partially ground on a separate tape and transferred to the apparatus 100 for further processing including further grinding, backside processing and dicing.

In another preferred embodiment of the invention, the wafer 140 may be ground to a desired thickness on a separate tape and transferred to the apparatus 100 for further processing including backside processing and dicing.

In yet another preferred embodiment of the invention, the processed wafer may be transferred to another dicing tape, device side face up for dicing and pick up after step 340.

In another preferred embodiment of the invention, the diced wafer (or dies) may be transferred to another tape with device side facing up following step 340 to facilitate pick up in a conventional manner.

Figure 4:
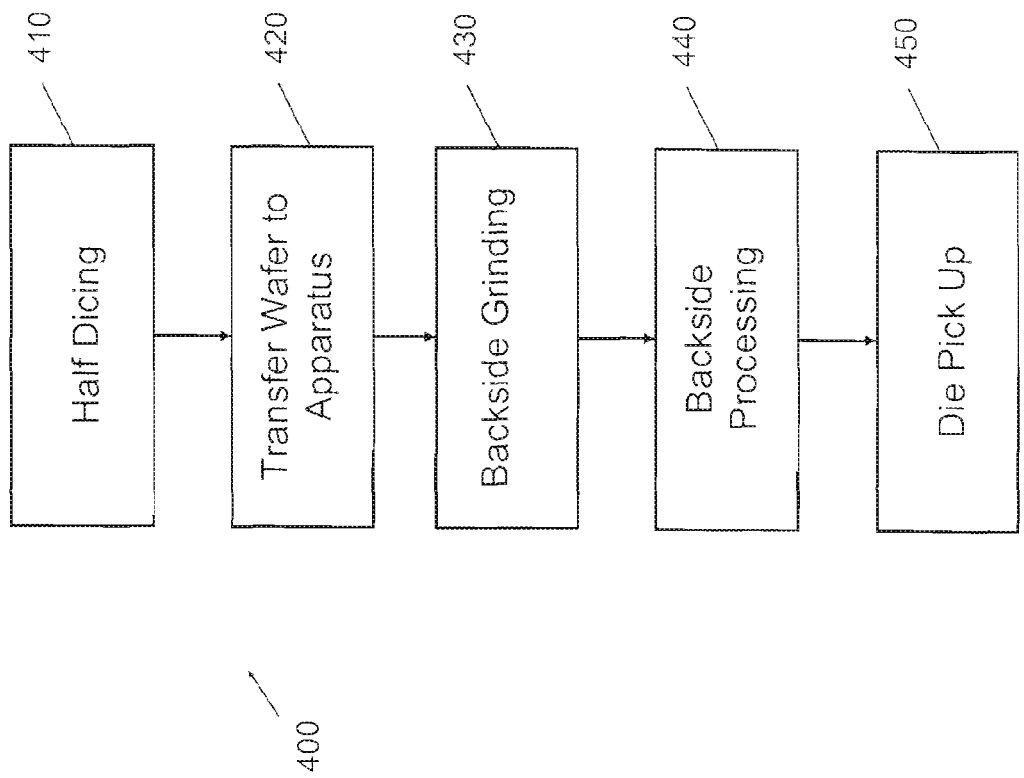
FIG. 4 is a flow chart of an alternative method of ultra thin wafer backside processing in accordance with the invention.

In accordance with another embodiment of the invention, the apparatus 100 may be employed in a method 400 (FIG. 4). The wafer 140 is half diced in a step 410 in a conventional manner. In a step 420, the half diced wafer and an outer ring 110 are mounted to a high temperature grinding tape 120. The wafer backside 145 is then ground to separate a plurality of dies in a step 430. In a step 440, backside processes such as ion implantation, native oxide etching, sputtering, and evaporation are performed. The dies are picked up in a step 450. Method 400 is effective in producing dies down to 1 mil thickness with back metal.

In another preferred embodiment of the invention, the die may be transferred to another tape for pick up after step 440.

In yet another preferred embodiment of the invention, another tape may be used to complete the dicing before grinding step. The dies may then be transferred to the tape 120 and mounted to the outer ring 110 before step 440.

Figure 5:
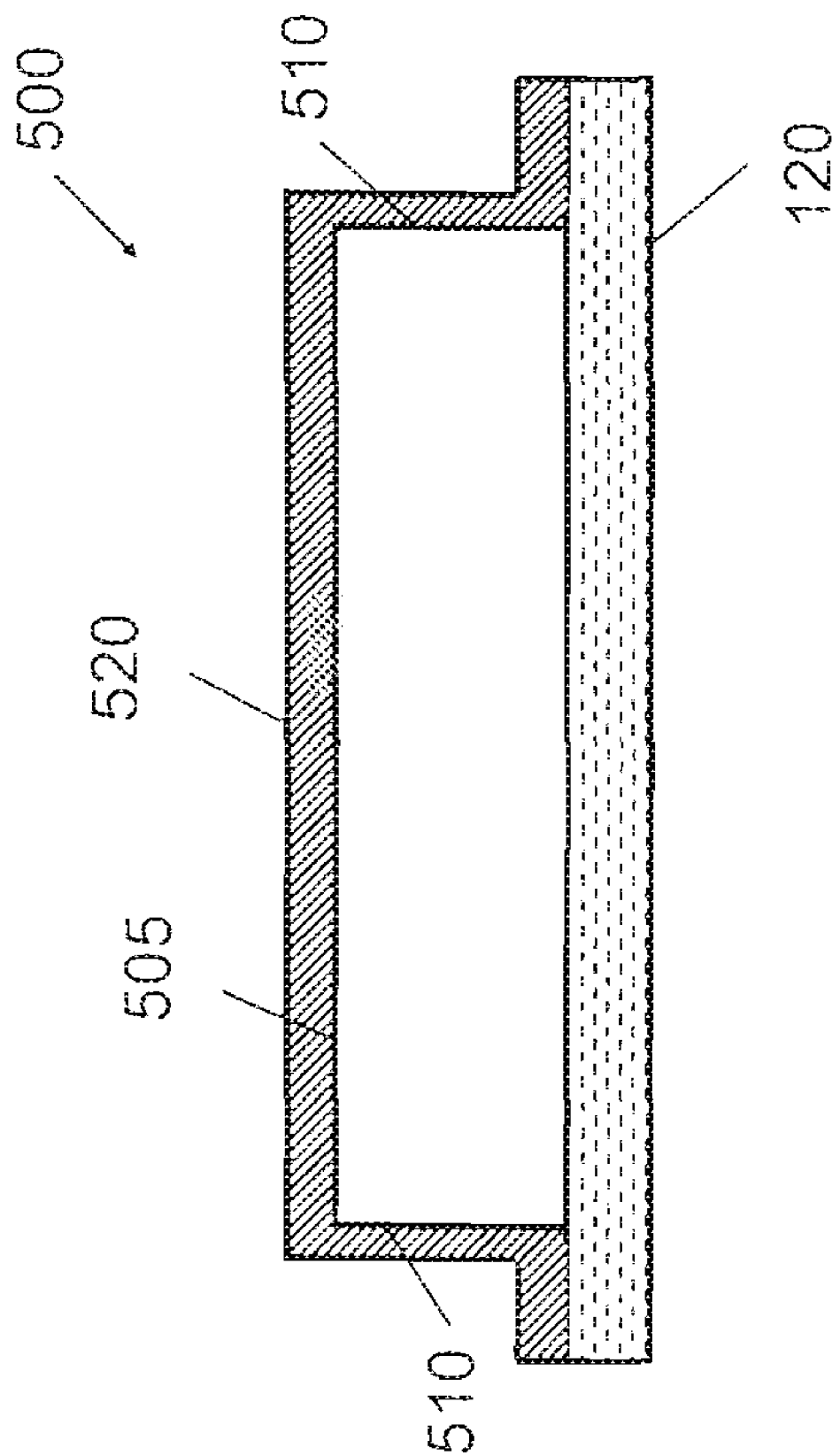
FIG. 5 is a schematic representation of a die having metalized backside and side walls mounted to a tape in accordance with the invention.
Figure 6:
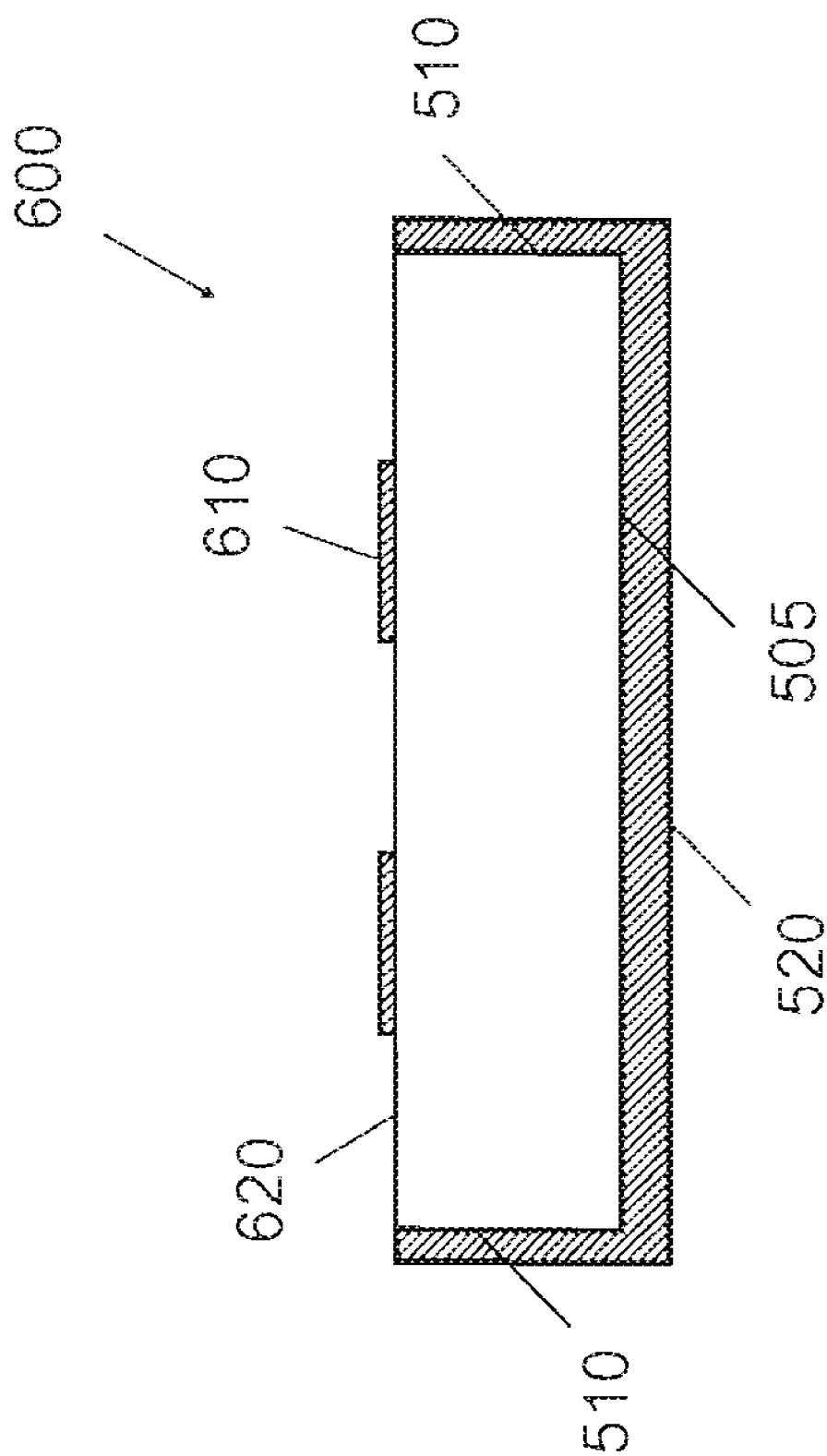
FIG. 6 is a schematic representation of a die having metalized backside and side walls in accordance with the invention.

In accordance with yet another embodiment of the invention, the apparatus 100 may be employed to deposit metal on die side walls. The tape 120 having a plurality of die attached thereto can be stretched while being mounted to the outer ring 110 to provide increased spacing between the plurality of die. Metal 520 is then deposited on die backsides 505 as well as side walls 510 of a die 500 as shown in FIG. 5. A completed die 600 having metal 520 on the backside 505 and side walls 510 and contact pads 610 on a die front side 620 is shown in FIG. 6.

Figure 7:
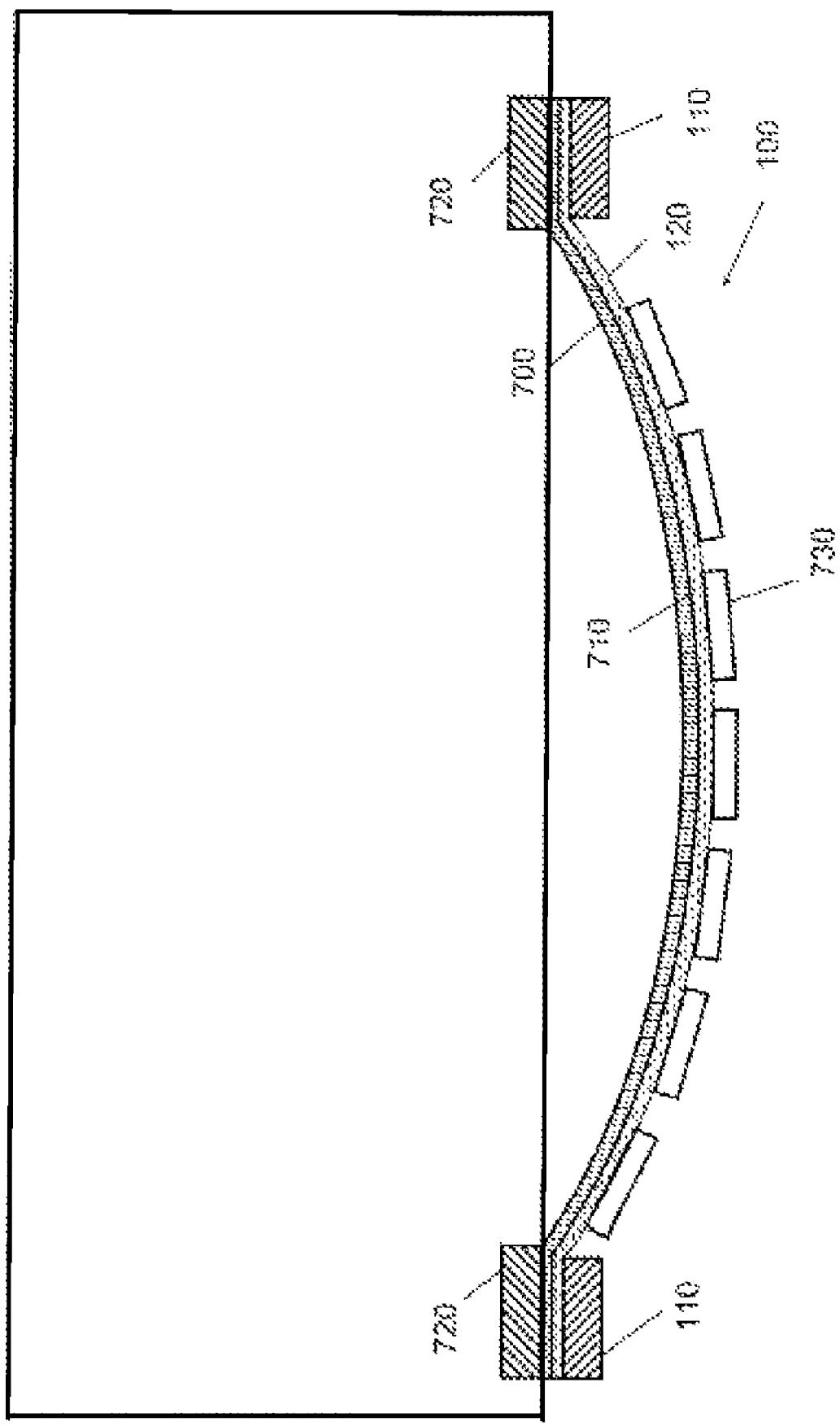
FIG. 7 is a schematic representation of a form having the apparatus of FIG. 1 mounted thereon.

With reference to FIG. 7, the apparatus 100 is shown clamped to a structure 700 having a curved surface 710. The structure 700 may be formed of metal and the apparatus 100 may be clamped using clamps 720. The curved surface 710 is operable to spread the plurality of die 730 adhered to the tape 120. Metal deposition is then used to deposit metal to the die backsides and side walls.

Figure 8:
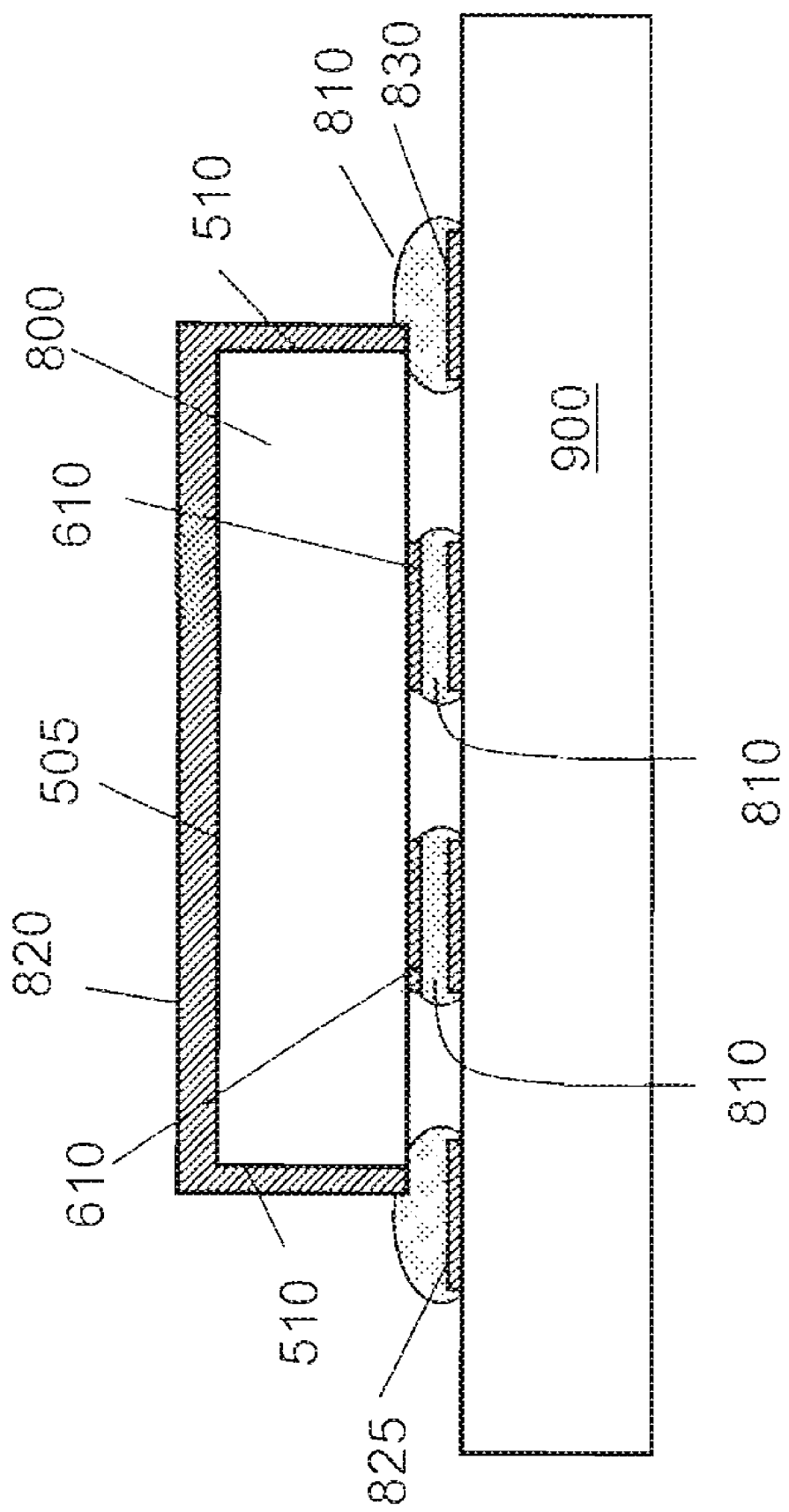
FIG. 8 is a schematic representation showing the die of FIG. 6 flip chip mounted to a printed circuit board in accordance with the invention.

A flip chip 800 having solderable metal on backside 505 and side walls 510 is shown mounted to a printed circuit board 900 having a solder preform 810 formed thereon in FIG. 8.

Figure 9:
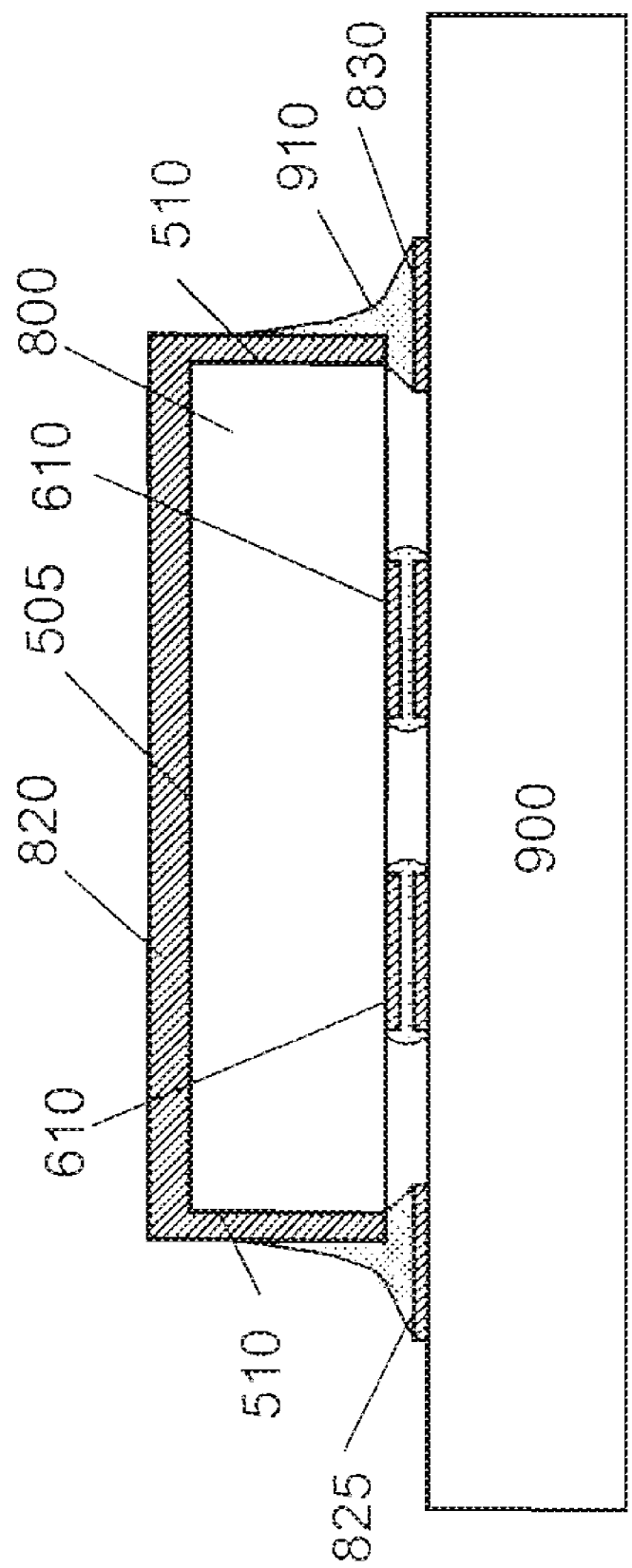
FIG. 9 is a schematic representation showing the die of FIG. 6 mounted to a printed circuit board in accordance with the invention and after solder reflow.

After solder reflow, contact pads 610 on die 800 make electrical contact with their corresponding pads on the printed circuit board 900, and back metal 820 makes electrical contact with contacts 825 and 830 on the printed circuit board 900, as shown in FIG. 9. A portion of solder material 910 may climb up along the solderable metal surface on die side walls and enable solid electrical connection to the die back side.

The inventive methods and apparatus for ultra thin wafer backside processing described herein provide for backside wafer processing that yields high wafer throughput with low risk of wafer breakage as compared to other prior art methods. In addition, the methods and apparatus are achievable at a low machine and consumables cost. Wafer area usage is high as the supporting frame is provided apart from the wafer itself.

It is apparent that the above embodiments may be altered in many ways without departing from the scope of the invention. Further, various aspects of a particular embodiment may contain patentably subject matter without regard to other aspects of the same embodiment. Still further, various aspects of different embodiments can be combined together. Accordingly, the scope of the invention should be determined by the following claims and their legal equivalents.

What is claimed is:

1. A method for ultra thin wafer backside processing comprising the steps of:
   mounting a ring and a wafer to a tape, such that a front side of the wafer is adhered to the tape, and the wafer is mounted within the ring;
   grinding a wafer back side;
   after the mounting step, processing the wafer back side with metallization while the wafer is supported by a support structure formed by the tape and ring; and
   depositing a metal layer on the wafer backside after grinding, and mounting the wafer and the ring on a tape, wherein the mounting is performed after the wafer is ground to a predetermined thickness; and
   dicing the wafer after the processing step.

2. The method of claim 1, wherein the wafer back side processing includes a process performed before said metallization, said process selected from the group consisting of ion implantation, annealing, etching, sputtering, and evaporation.

3. The method of claim 1, further comprising annealing the tape before the wafer back side processing step in a vacuum chamber.

4. The method of claim 1, further comprising picking up dies following the dicing step.

5. The method of claim 1, further comprising transferring the diced wafer onto another tape and picking up dies with the device side facing up.

6. The method of claim 1, further comprising partially grinding the wafer on a separate tape before the mounting step.

7. The method of claim 1, wherein the ring comprises a toroidal ring.

8. A method for ultra thin wafer backside processing comprising the steps of:
   grinding a backside of a wafer to a desired thickness;
   mounting the front side of the ground wafer and a ring to a tape after the grinding step, such that the ground wafer is mounted within the ring;
   processing the wafer back side with metallization while the wafer is supported by a support structure formed by the tape and the ring after the mounting step; and
   depositing a metal layer on the wafer backside after grinding, and mounting the wafer and the ring on a tape, wherein the mounting is performed after the wafer is ground to a predetermined thickness; and
   dicing the wafer after the processing step.

9. The method of claim 8, wherein the wafer back side processing includes a process performed before said metallization, said process selected from the group consisting of: ion implantation, annealing, etching, sputtering, and evaporation.

10. The method of claim 8, further comprising annealing the tape before the wafer, back side processing step in a vacuum chamber.

11. The method of claim 8, further comprising picking up dies following the dicing step.

12. The method of claim 8, further comprising transferring the diced wafer onto another tape and picking up dies with the device side facing up.

13. The method of claim 8, wherein the ring comprises a toroidal ring.

14. A method for ultra thin wafer backside processing comprising the steps of:
   grinding a back side of a wafer to a desired thickness;
   mounting a front side of the ground wafer and a ring to a tape after the grinding step, such that the ground wafer is mounted within the ring;
   processing the wafer back side with metallization while the wafer is supported by a support structure formed by the tape and the ring after the mounting step;
   transferring the processed wafer onto a separate dicing tape with the wafer back side adhered to the tape after the processing step; and depositing a metal layer on the wafer backside after grinding, and mounting the wafer and the ring on a tape, wherein the mounting is performed after the wafer is ground to a predetermined thickness; and
   dicing the wafer.

15. The method of claim 14, wherein the wafer back side processing includes a process performed before said metallization, said process selected from the group consisting of: ion implantation, annealing, etching, sputtering, and evaporation.

16. The method of claim 14, further comprising annealing the tape before the wafer back side processing in a vacuum chamber.

17. The method of claim 14, further comprising picking up dies following the dicing step.

18. The method of claim 14, wherein the ring comprises a toroidal ring.

19. A method of depositing metal on side walls of die comprising the steps of:
   mounting a plurality of dies on a support structure comprising a ring and a tape, such that the die are mounted within the ring; and
   depositing metal onto a back side and side walls of the plurality of dies while the die are supported by the support structure; and depositing the metal as a metal layer on the sidewalls of the plurality of dies after grinding a wafer comprising the plurality of dies to a predetermined thickness.

20. The method of claim 19, wherein the plurality of dies are formed using a dicing before grinding method on the support structure.

21. The method of claim 19, wherein the plurality of dies are formed using a dicing before grinding method on the tape, the tape being then mounted to the ring to form the support structure.

22. The method of claim 19, wherein the plurality of dies are mounted onto the tape and the tape is mounted onto the ring to form support structure after wafer separation into dies on a separate tape.

23. The method of claim 19, further comprising stretching the tape with dies attached before the mounting step onto the ring.

24. The method of claim 19, further comprising clamping the tape to a structure having a curved surface during the deposition step.

25. The method of claim 24, wherein the tape is clamped such that the dies are disposed on a convex surface of the structure.

* * * * *